United States Patent [19]

Forward et al.

[11] 4,176,331
[45] Nov. 27, 1979

[54] NETWORK FOR SIMULATING LOW-NOISE-TEMPERATURE RESISTORS

[75] Inventors: Robert L. Forward, Oxnard; Gary D. Thurmond, Calabasas, both of Calif.

[73] Assignee: Hughes Aircraft Company, Culver City, Calif.

[21] Appl. No.: 881,296

[22] Filed: Feb. 27, 1978

[51] Int. Cl.² .................. H03H 11/00; H03H 5/04
[52] U.S. Cl. ............................ 333/213; 333/217; 330/61 R
[58] Field of Search .......... 333/80 R, 80 T, 213, 333/217; 330/61 R, 108; 307/264

[56] References Cited

U.S. PATENT DOCUMENTS 3,921,105  11/1975  Brgelz ........................ 333/28 R

OTHER PUBLICATIONS

"Applications Manual for Computing Amplifiers for Modeling, Measuring, Etc."; Philbrick Researches, Inc.; Nimrod Press, Inc., Boston, 1966, p. 97.
"Electronic Cooling of Resistors"; by Hirakawa et al.; from Oral Presentation in Waterloo, Canada, Aug. 1977.

*Primary Examiner*—Paul L. Gensler
*Assistant Examiner*—Robert E. Wise
*Attorney, Agent, or Firm*—Don O. Dennison; W. H. MacAllister

[57] ABSTRACT

A class of two-terminal active networks which simulate low-noise-temperature resistors is disclosed. A single differential-input operational amplifier connected with a feedback resistor in an inverting amplifier configuration comprises the active element of the network. A resistive voltage divider feedback arrangement comprises the remainder of the circuit. Either positive or negative simulated resistors can be obtained with a wide range of equivalent resistance values and effective noise temperatures.

6 Claims, 7 Drawing Figures

Fig. 6.
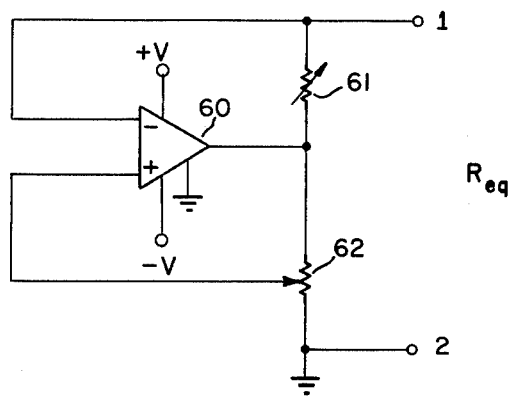
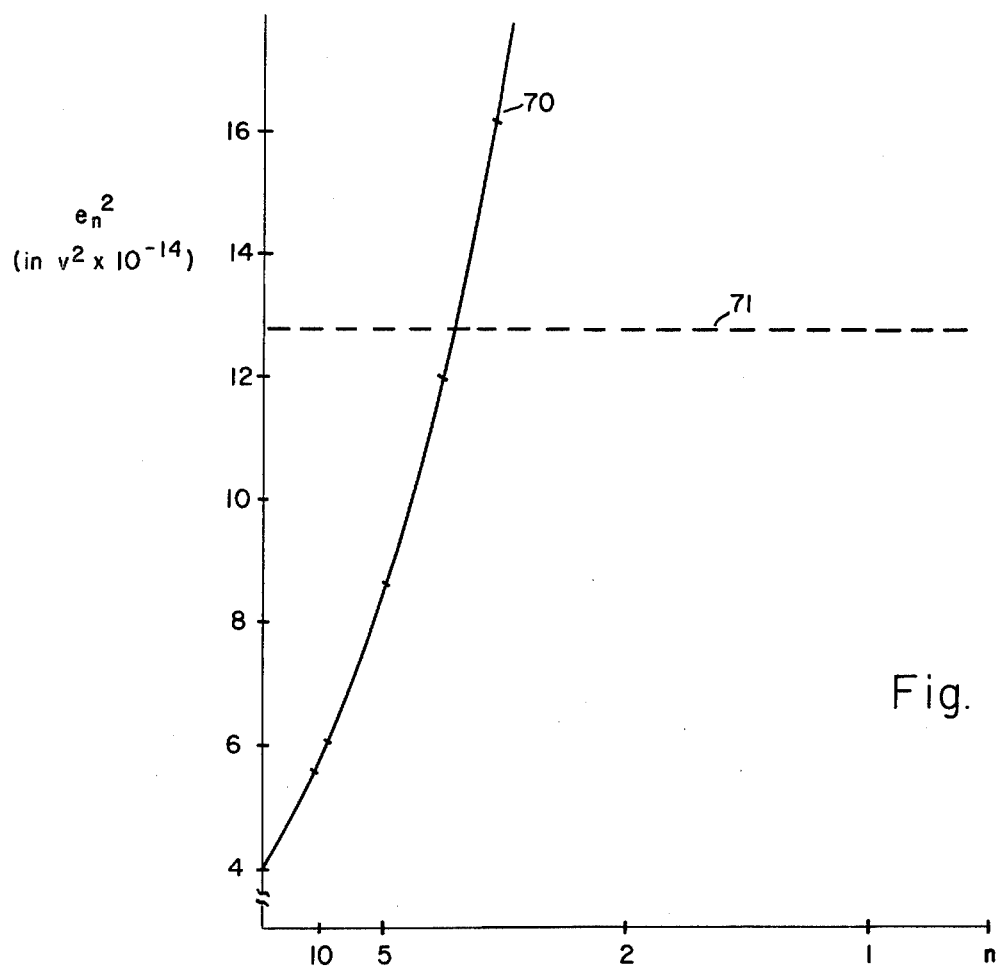
Fig. 7.

NETWORK FOR SIMULATING LOW-NOISE-TEMPERATURE RESISTORS

FIELD OF THE INVENTION

This invention relates to single-port electrical networks and more particularly to networks which simulate low-noise temperature electrical resistors.

DESCRIPTION OF THE PRIOR ART

It has long been known that all electrical resistors are characterized by an inherent noise which is due to the thermal agitation of the free electrons within the resistor material. As used herein, the term "resistor", includes any body of conductive material capable of carrying an electrical current. As such, the term embraces components such as wires and other conductors which are not ordinarily thought of as "resistors". If a signal current in the resistor or conductor is smaller than the random current due to thermal agitation then, as practical matter, the signal is masked by the noise and no amount of amplification can separate them. This noise, known as "thermal noise", "Johnson noise" or "white noise", has heretofore generally been accepted as one of the limiting factors in the design of low-level signal processing circuits.

From the research of Johnson and Nyquist in the late 1920s, it is known that the thermal noise voltage across the open ends of a resistor is determined by the formula:

$$e_n^2 = 4kTRB \qquad [1]$$

Where $e_n^2$ is the average of the square of the noise voltage; k is Boltzmann's constant ($1.38 \times 10^{-23}$ joules per °K.); T is the absolute temperature of the conductor in °K.; R is the resistance of the resistor or conductor in ohms and B is the bandwidth in Hertz over which the noise is measured.

In order to reduce the thermal noise of a given resistance R, it is seen from Equation [1] that either the temperature (T) or the bandwidth (B) must be reduced. To reduce B, of course, is generally not possible since the operational bandwidth of a circuit is ordinarily predetermined and is not susceptible to manipulation. In general, therefore, it has been the practice to minimize the thermal noise by cooling the resistor or the entire circuit, in some cases to cryogenic temperatures. However, since the noise voltage is proportional to the square root of the temperature, it is readily understood that it is both costly and cumbersome to provide the degree of cooling required to achieve a significant reduction in thermal noise. It is therefore an object of the present invention to provide a non-cryogenically cooled low-noise-temperature resistance.

In 1939, it was suggested by W. S. Percival that a simulated resistor having an effective noise temperature lower than ambient temperature could be realized by feedback means. (See: W. S. Percival, An Electrically "Cold" Resistance, the Wireless Engineer, Vol. 16, May 1939, pp. 237-240.) Utilizing a single transformer between the plate and grid circuit of a vacuum tube amplifier, Percival simulated a resistance having an effective temperature of 70° K. The same technique was later expanded upon by Strutt and Van der Ziel in an article entitled, "Suppression of Spontaneous Fluctuations in Amplifiers and Receivers for Electrical Communication and for Measuring Devices", Physica, Vol. 9, No. 6, June 1942, pp. 513, 527. Professor Van der Ziel also briefly summarized the techniques in his treatise "Noise", Prentice-Hall, New York, N.Y. 1954, pp. 291-283. (See also: U.S. Pat. No. 2,352,956; M. J. O. Strutt, et al.; July 4, 1944.)

The circuits of the prior art appear to have received little attention in the several decades since their introduction. This may be due to the many shortcomings in the use of vacuum tubes such as their high operating temperatures and the other sources of noise inherent therein. In any event, recent advances in solid state technology have produced many sophisticated, highly efficient, low-cost active circuit elements which allow the synthesis of economical low-noise-temperature resistance simulating circuits.

It is yet another object of the present invention to provide an active circuit which simulates a low-noise resistor.

A recent attempt at reducing circuit noise by feedback means is illustrated in U.S. Pat. No. 3,839,686 which was issued to W. Vogel on Oct. 1, 1974. According to the teachings of that invention, the induced voltage on a transmission line such as the outer conductor of a coaxial cable can be decreased by a feedback control circuit which includes an amplifier. Although the circuit of Vogel does not simulate a resistance, either low-noise or otherwise, it does represent an example of noise reduction employing feedback techniques.

In applicant's copending application Ser. No. 838,511, filed Oct. 3, 1977, there is disclosed a class of networks utilizing dual or single transformers in conjunction with a current responsive voltage source to realize simulated low-noise-temperature resistors. The present invention is directed to another class of such circuits.

SUMMARY OF THE INVENTION

In keeping with the principles of the present invention, the above and other objects are accomplished in a single-port circuit by sensing the current flow into the port and generating at the port a voltage which is proportional to the current. By utilizing a differential-input operational amplifier which senses the port input current and in response thereto generates a port output voltage, a simulated resistor can be obtained. If the circuit is comprised of ideal components, then the resulting circuit is characterized by an input impedance which obeys Ohm's Law (at least over a given frequency range) and has no thermal noise contribution. Of course, the non-ideal circuit elements utilized in practical embodiments of the present invention result in some thermal noise, although much less than that of a passive resistor. Thus, active circuits operating at room temperature can be made to approximate resistors operating at cryogenic temperatures.

In keeping with the present invention, embodiments are disclosed which utilize resistive voltage divider networks in the feedback path. Circuits for simulating both positive and negative low-noise-temperature resistors are disclosed. In order to distinguish the positive low-noise simulated resistors of the present invention from conventional (i.e. noisy) resistors the term "absorbor" has been adopted. Similarly, for the negative low-noise resistors the term "desorbor" has been adopted. In both instances, the "absorbance" and "desorbance" of the circuits of the invention have the traditional dimension of ohms.

BRIEF DESCRIPTION OF THE DRAWINGS

The above-mentioned and other features and object of the present invention will become more apparent by reference to the following description taken in conjunction with the accompanying drawings wherein like reference numerals denote like elements and in which:

FIG. 6 is a schematic diagram of a test circuit similar to the desorbor of FIG. 2; and FIG. 7 is a graphical representation of the noise versus feedback parameter of the circuit of FIG. 6.

DESCRIPTION OF THE PREFERRED EMBODIMENTS

Figure 1:
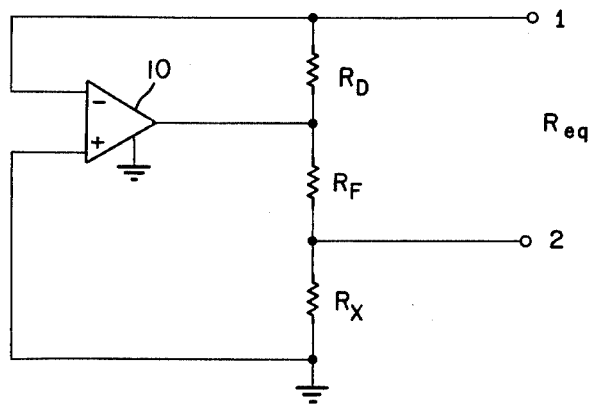
FIG. 1 is a schematic diagram of an active circuit which simulates a positive low-noise-temperature resistor.

In FIG. 1, there is shown a schematic diagram of an active circuit which simulates a positive low-noise-temperature resistor or "absorbor". In FIG. 1, the serial combination of resistors $R_D$, $R_F$ and $R_X$ is provided between a first circuit terminal 1 and ground. A second circuit terminal 2, is connected to the junction of resistors $R_F$ and $R_X$. An operational amplifier (op-amp) 10 is connected with its non-inverting input to ground and its inverting input to terminal 1. The output of op-amp 10 is connected to the junction of resistors $R_D$ and $R_F$, with the output return path connected to ground. For the sake of clarity, the power supply connections and compensating circuitry have been omitted form the diagram of FIG. 1; however, it is understood that a suitable DC power source and compensating circuitry can be employed as is well-known in the art.

If it is assumed for the time being that op-amp 10 is an ideal operational amplifier, then the following observations can be made with respect to the equivalent circuit represented by FIG. 1. The equivalent resistance of the circuit viewed from terminals 1-2 is given by the equation:

$$R_{eq} = \frac{(R_D + R_F)}{\frac{(R_F + R_X)}{R_X}} \quad [2]$$

Furthermore, if:

$$n = \frac{R_F + R_X}{R_X}, \quad [3]$$

then the equivalent resistance looking into terminals 1-2 reduces to:

$$R_{eq} = \frac{R_D + R_F}{n}, \quad [4]$$

For the usual situation where $R_D \gg R_F$ Equation [4] reduces to:

$$R_{eq} \approx \frac{R_D}{n}. \quad [4a]$$

Since the term n merely represents the reciprocal of the voltage ratio represented by the voltage divider network formed by series resistor $R_F$ and $R_X$, its value can be easily selected to provide any desired equivalent resistance as will be mentioned in greater detail hereinbelow. However, the low noise behavior of the circuit of FIG. 1 is enhanced when the value of the equivalent resistance $R_{eq}$ is within a predetermined range.

Figure 2:
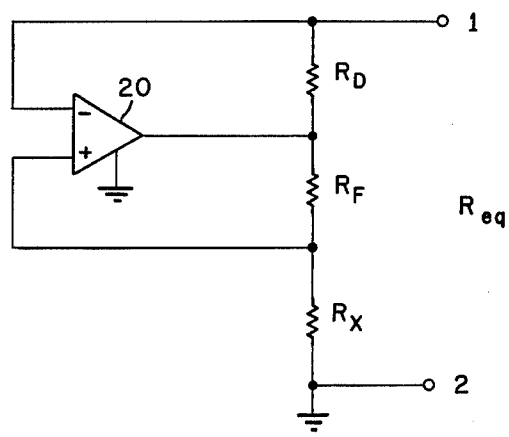
FIG. 2 is a schematic diagram of an active circuit which simulates a negative low-noise-temperature resistor.

Referring to FIG. 2, there is shown a schematic diagram of an active circuit which simulates a negative low-noise-temperature resistance or "desorbor". The circuit of FIG. 2 is similar to the circuit of FIG. 1 in that it also employs an ideal operational amplifier 20 with its inverting input connected to network terminal 1. A voltage divider network comprising the serial combination of resistors $R_D$, $R_F$ and $R_X$ is connected between terminal 1 and ground. In the case of the embodiment of FIG. 2, the second network terminal 2 is at ground potential with the connection of the non-inverting input of op-amp 20 being made to the junction of resistors $R_F$ and $R_X$. An analysis of the circuit of FIG. 2 yields a value for the equivalent resistance $R_{eq}$ of:

$$R_{eq} = -\frac{R_X}{R_F} R_D \quad [5]$$

and substituting n from Equation [3], $$R_{eq} = -\frac{R_D}{n-1} \quad [6]$$

Thus, it is seen that the circuit of FIG. 2 comprises an active circuit which simulates a low-noise-temperature negative resistance having a value determined by the relationship between the voltage divider resistors $R_F$ and $R_X$ and the feedback resistor $R_D$. Again, the equivalent noise voltage provided by the circuit of FIG. 2, like the circuit of FIG. 1 can be made smaller than the noise voltage expected from a passive resistance determined by the noise equation of FIG. 1. This noise voltage will be derived hereinbelow in connection with the circuit showing in FIG. 4.

As a practical matter, however, it is not possible to realize the circuit of FIG. 1 or 2 with perfect circuit elements. All practical circuits are characterized by finite internal resistances and concomitant thermal noise and in most cases, by inherent bandwidth limitations. To the extent that the circuits described herein employ non-ideal circuit elements, so too will the resulting circuits depart from ideal. Because of the versatility and advantages enjoyed by operational amplifiers, the embodiments described herein are illustrated using op-amps as the active circuit element. It is understood, however, that other amplifying devices such as discrete transistors may be employed in many instances.

Figure 3:
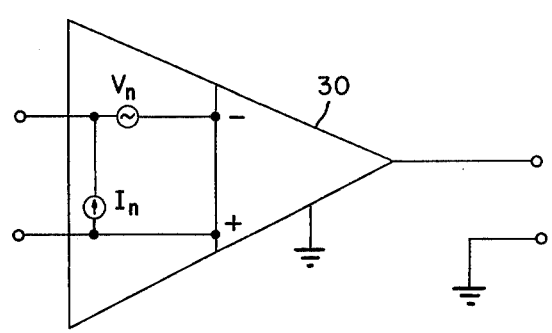
FIG. 3 is a circuit model of an operation amplifier illustrating its input-referred voltage and current noise sources.

The source of some of the above-mentioned non-ideal circuit characteristics can be considered in connection with the schematic diagram of FIG. 3 which represents a circuit model of an operational amplifier which as a first approximation takes into account its input-referred noise components. The circuit model of the op-amp of FIG. 3 comprises an ideal section 30 with its conventional inverting and non-inverting input ports and an output port. The op-amp noise sources are modeled as a series voltage-noise generator $V_n$ and a shunt current-noise generator $I_n$ at the input ports.

When the noise model of FIG. 3 is substituted for the ideal op-amp in the circuit of FIG. 1, it is found that the thermal noise of the circuit is given by:

$$e_n^2 = \frac{(n-1)^2 V_n^2 + 4kTB(n^2-n)R_x^2 + I_n^2 n^2 R_D^2 + 4kTBR_D}{n^2} \quad [7]$$

Solving equations [3] and [4] for $R_D$ and substituting in Equation [7] and then letting $R_X$ and $R_F$ approach zero while maintaining n constant, the noise voltage becomes:

$$e_n^2 = \frac{(n-1)^2 V_n^2 + I_n^2 n^2 R_{eq}^2 + 4kTBnR_{eq}}{n^2} \quad [8]$$

Similarly, if the foregoing substitutions and simplifications are made to the circuit of FIG. 2, the thermal noise contribution of a negative resistor or desorber is given by:

$$e_n^2 = \frac{n^2 V_n^2 + I_n^2(n-1)^2 R_{eq}^2 + 4kTB(n-1)R_{eq}}{(n-1)^2} \quad [9]$$

As the op-amps approach ideal, the terms $V_n$ and $I_n$ approach zero and the equations for the thermal noise contribution of the simulated resistance of FIG. 1 becomes $$e_n^2 = \frac{4kTBR_{eq}}{n} \quad [10]$$

and for the desorber of FIG. 2:

$$e_n^2 = \frac{4kTBR_{eq}}{(n-1)} \quad [11]$$

Thus, discounting the noise of the op-amp, for values of n greater than 1 the absorbor of FIG. 1 begins to look like a "cooled resistor". The (n−1) factor in the denominator of Eq. [11], on the other hand, means that in the case of the desorbor of FIG. 2, the "electronic cooling" is not observed until n is greater than 2. For values of n less than these values, the absorbor and desorbor circuits display effective noise temperatures greater than room temperature.

The op-amp current and voltage noise contributions are typically much less than the thermal noise contribution of $R_D$. These noise sources, however, become significant for large values of n and in fact become the limiting factor for practical thermal noise reduction.

Figure 4:
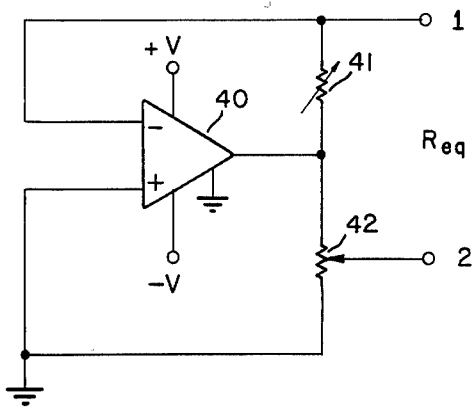
FIG. 4 is a schematic diagram of a test circuit similar to the absorbor of FIG. 1.

Referring more specifically to the drawing of FIG. 4, there is shown a schematic representation of a test circuit similar to the absorbor of FIG. 1. In the circuit of FIG. 4 a variable resistance 41 is connected between the output of op-amp 40 and its inverting input to allow the circuit equivalent resistance $R_{eq}$ to be maintained at a given test value. The voltage divider resistors $R_F$ and $R_X$ of FIG. 1 have been replaced by a continuously adjustable potentiometer 42 so that n can be adjusted from 1 upward. Direct current supply potentials for op-amp 40 are indicated as +V and −V.

Figure 5:
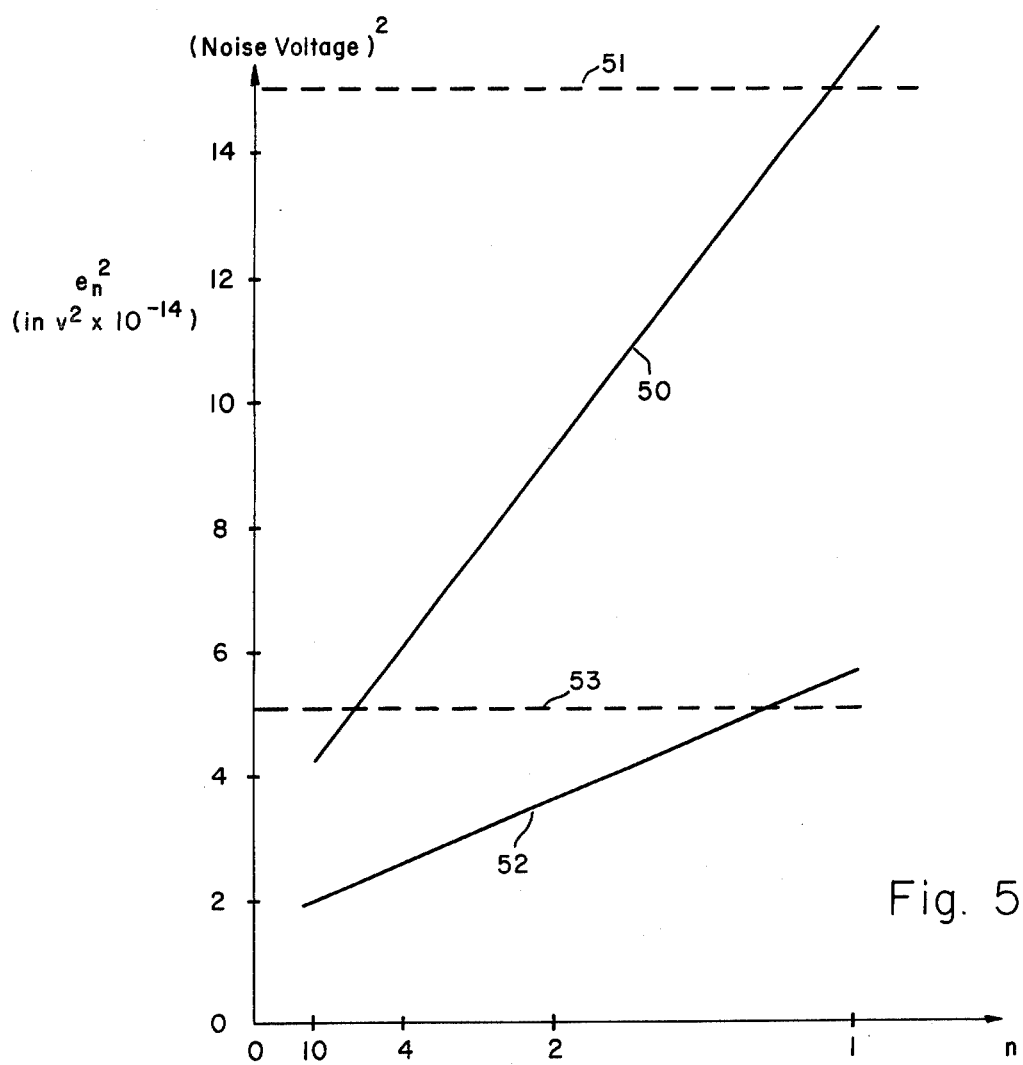
FIG. 5 is a graphical representation of the noise versus feedback parameter of the circuit of FIG. 4.

A plot of the noise voltage squared $(e_n^2)$ plotted as a function of n is shown in the graph of FIG. 5. Solid curve 50 represents the noise of an absorbor of $R_{eq}=100,000$ ohms. Dotted curve 51 represents the thermal noise of a passive 100,000 ohm resistor for comparison purposes. It is seen that for values of n more than about 1.1 the simulated resistance displays a lower noise than the passive resistor under the same measurement conditions. In each case measurements were made with instruments having a very high input impedance presenting substantially an open circuit to the circuit under test.

Curves 52 and 53 represent respectively the noise voltage squared $(e_n^2)$ for an absorbor and a passive resistor, both having a resistance of 35,000 ohms. Again, low-noise behavior is noted for values of n less than approximately 1.1. The 1/n behavior of the simulated low noise resistors predicted by Equations [7], [8] and [10] is apparent from curves 50 and 52.

In FIG. 6 there is shown a schematic diagram of a test circuit which simulates a negative resistor or desorber. As in the circuit of FIG. 4, a variable resistor 61 replaces the feedback resistor $R_D$ and a potentiometer 62 replaces the voltage divider resistors $R_F$ and $R_X$. The supply potentials for op-amp 60, are again indicated by +V and −V.

A graphical representation of the square of the noise voltage $(e_n^2)$ is shown in FIG. 7 by curve 70. Curve 70 represents the noise behavior of a desorber having an equivalent resistance $R_{eq}$ of −100,000 ohms. For comparison purposes, curve 71 indicates the noise voltage squared of a passive 100,000 ohm resistor. It is noted that curve 70 displays a marked curvature which demonstrates the expected $(n/n-1)^2$ and $1/(n-1)$ behavior predicted by Equations [9] and [11]. For the case of the 100,000 ohm desorber low noise behavior is observed only for values of n less than approximately 3.

In all cases, it is understood that the above-described embodiments are merely illustrative of but a few of the many possible specific embodiments which can represent applications of the principles of the present invention. Numerous and varied other arrangements can be readily devised in accordance with these principles by those skilled in the art without departing from the spirit and scope of the invention.

What is claimed is:

1. A two-terminal network for simulating a resistance comprising, in combination:
   an amplifier having first and second differential input terminals, an output terminal and a common ground;
   a first resistor $R_D$;
   means for connecting said first resistor between said first differential input terminal and said output terminal;
   second and third resistors $R_F$ and $R_X$, respectively;
   means for serially connecting said second and third resistors between said output terminal and ground;
   means for connecting said second differential input terminal to ground;
   one of said network terminals being connected to said first differential input terminal, the other of said network terminals being connected to the junction of said second and third resistors and
   wherein the resistance simulated at said network terminals is substantially proportional to $R_D$.

2. The network according to claim 1 wherein the resistance simulated at said network terminals is substantially inversely proportional to the ratio $(R_F+R_X)/R_X$.

3. A two-terminal network for simulating a low-noise-temperature resistance comprising, in combination:
- an amplifier having first and second differential input terminals, an output terminal and a common ground;
- a first resistor $R_D$;
- means for connecting said first resistor between said first differential input terminal and said output terminal;
- second and third resistors $R_F$ and $R_X$, respectively;
- means for serially connecting said second and third resistors between said output terminal and ground;
- means for connecting said second differential input terminal to a first end of said third resistor;
- said first differential input terminal defining one terminal of said network;
- the second end of said third resistor defining the other terminal of said network; and
- wherein the ratio $(R_F+R_X)/R_X$ is greater than three.

4. The network according to claim 3 wherein the resistance simulated at said network terminals is substantially proportional to $R_D$.

5. The network according to claim 3 wherein the resistance simulated at said network terminals is substantially inversely proportional to the ratio $(R_F+R_X)/R_X$.

6. The network according to claim 3 wherein the value of $R_F$ is at least three times the value of $R_X$.

* * * * *